United States Patent
Miyake

(10) Patent No.: US 6,519,293 B1
(45) Date of Patent: Feb. 11, 2003

(54) RADIO TRANSMITTER AND RADIO COMMUNICATION METHOD

(75) Inventor: Atsushi Miyake, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/445,364

(22) PCT Filed: Mar. 3, 1998

(86) PCT No.: PCT/JP98/02462
§ 371 (c)(1),
(2), (4) Date: Dec. 10, 1999

(87) PCT Pub. No.: WO99/63674
PCT Pub. Date: Dec. 9, 1999

(51) Int. Cl.[7] .......................... H04L 25/03; H04L 25/49; H04K 1/02; H04B 1/04
(52) U.S. Cl. .......................... 375/297; 375/296; 455/126
(58) Field of Search ................................. 375/297, 296; 455/126; 330/127

(56) References Cited

U.S. PATENT DOCUMENTS

| | | | |
|---|---|---|---|
| 4,760,347 A | * 7/1988 | Li et al. ..................... | 330/127 |
| 5,193,224 A | * 3/1993 | McNicol et al. ............. | 455/126 |
| 5,204,637 A | * 4/1993 | Trinh .......................... | 330/129 |
| 5,303,268 A | * 4/1994 | Tsutsumi et al. ............ | 375/296 |
| 5,369,789 A | * 11/1994 | Kosugi et al. ............... | 455/126 |
| 5,376,895 A | * 12/1994 | Aihara ....................... | 330/129 |
| 5,442,322 A | * 8/1995 | Kornfeld et al. ............. | 330/285 |
| 5,553,318 A | * 9/1996 | Ohmagari et al. ........... | 455/126 |
| 6,069,530 A | * 5/2000 | Clark .......................... | 330/149 |
| 6,173,160 B1 | * 1/2002 | Liimatainen ................ | 455/67.1 |

\* cited by examiner

*Primary Examiner*—Chi Pham
*Assistant Examiner*—Tony Al-Beshrawi
(74) *Attorney, Agent, or Firm*—Rothwell, Figg, Ernst & Manbeck

(57) ABSTRACT

A radio transmitter in which a power level of a modulated signal that has been amplified by an amplifier is detected, an error component is detected by comparing the detected power level with a theoretical value, an ideal value is calculated by adding the error component to the theoretical value, a reference level is generated by comparing the ideal value with the error component, and the gain of the amplifier is controlled based on a difference between the detected power level and the generated reference level.

15 Claims, 11 Drawing Sheets

FIG.5
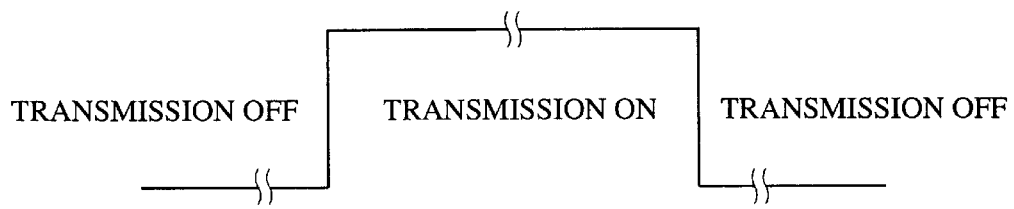
(a) INTERVAL OF ONE SLOT OF RF SIGNAL
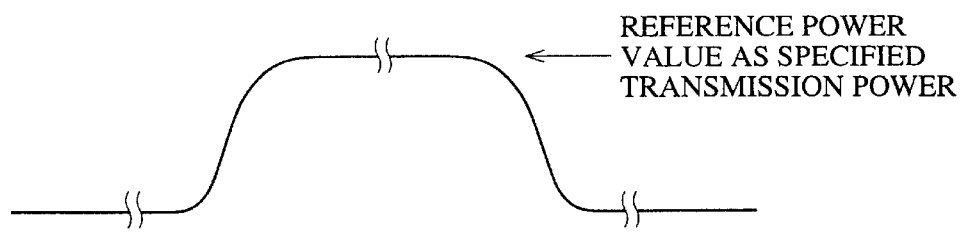
(b) SHAPE OF FEEDBACK SIGNAL
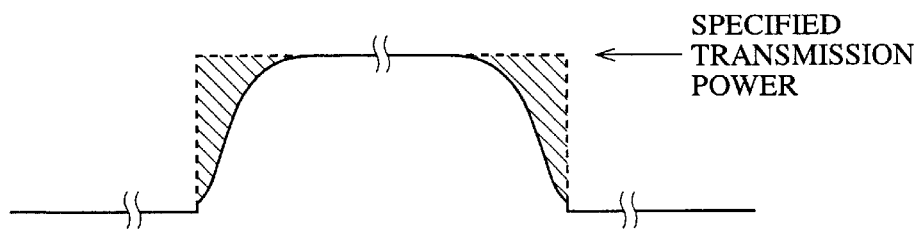
(c) SHAPE OF RF SIGNAL

FIG.8

| | bit | C THEORETICAL VALUE | D POWER VALUE | E ERROR COMPONENT | F IDEAL VALUE | G REFERENCE POWER VALUE |
|---|---|---|---|---|---|---|
| | 1 | /////// | aa | aa−a=a' | a+a' | (a+a')−a' |
| | 2 | b | bb | bb−b=b' | b+a' | (b+a')−b' |
| | 3 | c | cc | cc−c=c' | c+a' | (c+a')−c' |
| | 4 | d | dd | dd−d=d' | d+a' | (d+a')−d' |
| | 5 | e | ee | ee−e=e' | e+a' | (e+a')−e' |
| | 6 | f | ff | ff−f=f' | f+a' | (f+a')−f' |
| | 7 | g | gg | gg−g=g' | g+a' | (g+a')−g' |
| | 8 | h | hh | hh−h=h' | h+a' | (h+a')−h' |
| | 9 | i | ii | ii−i=i' | i+a' | (i+a')−i' |
| | 10 | j | jj | jj−j=j' | j+a' | (j+a')−j' |
| | 11 | k | kk | kk−k=k' | k+a' | (k+a')−k' |
| | 12 | l | ll | ll−l=l' | l+a' | (l+a')−l' |
| | 13 | m | mm | mm−m=m' | m+a' | (m+a')−m' |
| | 14 | n | nn | nn−n=n' | n+a' | (n+a')−n' |
| | 15 | o | oo | oo−o=o' | o+a' | (o+a')−o' |

FIG.10

| bit | SPECIFIED POWER DETERMINED VALUE | BB INFORMATION | ERROR COMPONENT IN BB INFORMATION | BB INFORMATION AFTER LEVEL CONVERSION | POWER VALUE | ERROR COMPONENT | IDEAL VALUE | REFERENCE POWER VALUE |
|---|---|---|---|---|---|---|---|---|
| 1 | a | bb1 | a−bb1=bbe | bb1+(a−bb1)=bb1' (=a) | aa | aa−bb1'=a' | bb1'+a' | (bb1'+a')−a'=bb1' (=a) |
| 2 | — | bb2 | — | bb2+bbe=bb2' | bb | bb−bb2'=b' | bb2'+a' | (bb2'+a')−b' |
| 3 | — | bb3 | — | bb3+bbe=bb3' | cc | cc−bb3'=c' | bb3'+a' | (bb3'+a')−c' |
| 4 | — | bb4 | — | bb4+bbe=bb4' | dd | dd−bb4'=d' | bb4'+a' | (bb4'+a')−d' |
| 5 | — | bb5 | — | bb5+bbe=bb5' | ee | ee−bb5'=e' | bb5'+a' | (bb5'+a')−e' |
| 6 | — | bb6 | — | bb6+bbe=bb6' | ff | ff−bb6'=f' | bb6'+a' | (bb6'+a')−f' |
| 7 | — | bb7 | — | bb7+bbe=bb7' | gg | gg−bb7'=g' | bb7'+a' | (bb7'+a')−g' |
| 8 | — | bb8 | — | bb8+bbe=bb8' | hh | hh−bb8'=h' | bb8'+a' | (bb8'+a')−h' |
| 9 | — | bb9 | — | bb9+bbe=bb9' | ii | ii−bb9'=i' | bb9'+a' | (bb9'+a')−i' |
| 10 | — | bb10 | — | bb10+bbe=bb10' | jj | jj−bb10'=j' | bb10'+a' | (bb10'+a')−j' |
| 11 | — | bb11 | — | bb11+bbe=bb11' | kk | kk−bb11'=k' | bb11'+a' | (bb11'+a')−k' |
| 12 | — | bb12 | — | bb12+bbe=bb12' | ll | ll−bb12'=l' | bb12'+a' | (bb12'+a')−l' |
| 13 | — | bb13 | — | bb13+bbe=bb13' | mm | mm−bb13'=m' | bb13'+a' | (bb13'+a')−m' |
| 14 | — | bb14 | — | bb14+bbe=bb14' | nn | nn−bb14'=n' | bb14'+a' | (bb14'+a')−n' |
| 15 | — | bb15 | — | bb15+bbe=bb15' | oo | oo−bb15'=o' | bb15'+a' | (bb15'+a')−o' |

RADIO TRANSMITTER AND RADIO COMMUNICATION METHOD

TECHNICAL FIELD

The present invention relates to a radio transmitter and a radio transmission method capable of compensating the spread of a band width of a power spectrum while a transmission wave is transmitted in burst transmission.

BACKGROUND ART

FIG. 1 is a diagram showing a configuration of a conventional radio transmitter. In FIG. 1, the reference number 1 designates an amplifier for amplifying a RF signal that has been modulated based on GMSK (Gaussian filtered Minimum Shift Keying) modulation, and 2 denotes a coupler for outputting a large part of the power of the RF signal that has been amplified by the power amplifier 1 and for outputting the remaining part of the power of the RF signal to a detector indicated by the reference number 3. This detector 3 detects a power value of the RF signal transferred from the coupler 2. The reference number 4 designates a controller for generating a reference power value corresponding to the transmission power of the RF signal in burst transmission. This controller 4 comprises a CPU, a DSP, a power source circuit, an audio circuit, a digital to analogue converter, and other components. The reference number 5 denotes a differential amplifier for comparing the power value outputted from the detector 3 with the reference power value outputted from the controller 4 and for generating a feedback signal in order to control the gain of the power amplifier 1.

Next, a description will be given of the operation.

In general, each of mobile communication devices represented by cellular telephones incorporates an APC (Automatic Power Control) circuit in order to control the range of a transmission power of the RF signal as a transmission wave within a specified range to be used in a radio communication system even if the change of circumstance conditions such as a voltage of a power source or an ambient temperature happens.

In the configuration shown in FIG. 1, because a feedback signal is fed to the power amplifier 1, the gain of the power amplifier 1 is so controlled that the transmission power is set into a constant range. That is to say, because the APC circuit is a negative feedback circuit, in order to output the RF signal having a constant power value, the gain of the power amplifier 1 is decreased when the power of the RF signal is increased, and conversely, the gain of the power amplifier 1 is increased when the power of the RF signal is decreased.

When TDMA (Time Division Multiple Access) is used as a communication access, the RF signal as the transmission wave is transmitted in burst transmission, not transmitted continuously.

FIG. 2 is a diagram showing an example of a configuration of a TDMA frame for GSM (Global System for Mobile Communications) that has been used in Europe and all over the world. The time interval of one TDMA frame is 4.62 ms. The TDMA frame has the following configuration.

One TDMA frame: eight time slots:4.62 ms. When the RF signal is transmitted in burst transmission by using the slot (2) in the current TDMA frame shown in FIG. 2, the following RF signal is transmitted by using the time slot (2) in the following TDMA frame.

FIG. 3 is a diagram showing a transmission state of the TDMA frame in the radio transmitter. In FIG. 3, the radio wave is transmitted during the transmission ON state and not transmitted during the transmission OFF state in burst transmission.

However, the effect of the rising edge and the falling edge of the transmission wave on a frequency axis to the power spectrum is not ignored. In general, the time interval of each of the rising edge and the falling edge of the transmission wave is determined based on a system standard to be applied. For example, FIG. 4 shows a time interval of each of the rising edge and the falling edge of the transmission wave in GSM standard. The time interval in the part other than the rising edge and the falling edge of the transmission wave is changed according to the kind of transmission burst. On the other hand, the time interval of each of the rising edge and the falling edge must be set within the time interval of 28 us.

In a case that the RF signal transferred from an actual radio transmitter is applied to the transmission time mask shown in FIG. 4, the rising edge and the falling edge of the RF signal adequately satisfy the GSM standard when a time slot as one transmission interval of the RF signal has a completely square wave. However, because the RF signal is a pulse sequence of the square wave and the power spectrum of this RF signal requires an infinite band, a side-band of the RF signal is increased and the RF signal does not satisfy the transmission spectrum standard.

In order to avoid this drawback, in general, a band limitation is used. This method uses a band limitation filter such as a cosine roll-off filter, through which a base-band signal to be modulated is transferred, that satisfies a Nyquist standard (intersymbol interference of zero). However, this method requires that a system to be used after the modulation based on the base-band signal must be a linear basically. For this reason, this method is commonly used in systems using a linear modulation method such as $\pi/4$ shift QPSK modulation. On the contrary, the GMSK modulation used in this conventional example shown in FIG. 1 has a constant envelope curve, and in terms of a current consumption, that is to say, of a talk time of a mobile device, most power amplifiers of the linear type are not used as the power amplifier 1 shown in FIG. 1.

In the band limitation in the power spectrum in the conventional example shown in FIG. 1, the rising edge and the falling edge of the RF signal as an actual transmission wave are controlled by adjusting the gain of the power amplifier 1 based on the feedback signal. Substantially, the gain of the power amplifier 1 is controlled based on a reference power value outputted from the controller 4 and data (as these reference power values) corresponding to the rising edge and the falling edge of the transmission wave are stored in a memory in the controller 4. In the adjusting stage for the radio transmitter, it may be acceptable that adjusting values as the data are stored in the memory while observing the time mask on the time axis of the power of the RF signal and the power spectrum on the frequency axis, or calculated adjusting data are prepared in advance and then stored in the memory.

For the calculation of the data, there are methods to calculate the data based on the theory of window functions such as a Hamming window or a Hanning window, for example. FIG. 5 shows three cases of the band limitation to the RF signal by the power amplifier 1. In FIG. 5, when the RF signal is inputted shown in FIG. 5(a), and the gain of the power amplifier 1 is controlled based on the feedback signal as shown in FIG. 5(b), the output of the RF signal becomes the waveform shown by the solid line in FIG. 5(c). This waveform means the window that has been cut shown in FIG. 5(b) when the RF signal is considered as a square pulse (a pulse sequence). When this window is considered as a time function, the data described above can be calculated. In all of the cases, the time interval of each of the rising time and the falling time of the RF signal satisfies the standard defined by the system using this RF signal.

Because the conventional radio transmitter has the configuration described above, the controller 4 can control preciously the spread of the band of the power spectrum only when the shape of the reference power value on the time axis outputted from the controller 4 is equal to the shape of the RF signal on the time axis. However, in an actual case, because the shape of the reference power value on the time axis is not always equal to the shape of the RF signal on the time axis, it must be necessary to adjust the reference power value of each radio transmitter while radio transmitters are manufactured. In addition, even if the shape of the reference power value on the time axis is equal to the shape of the RF signal on the time axis, the total gain of the transmitter system also varies widely if there is the variations of characteristics of the power amplifier 1, the coupler 2, and other circuit components incorporated in the radio transmitter. The shape of each of the rising edge and the falling edge of the RF signal is thereby distorted. When the degree of the distortion is greater, it is necessary to adjust the reference power value.

Accordingly, an object of the present invention is, with due consideration to the drawbacks of the conventional technique, to provide a radio transmitter and a radio transmission method capable of suppressing the spread of the band of the power spectrum preciously without adjusting the reference power value after manufacturing.

DISCLOSURE OF INVENTION

In carrying out the invention and according to one aspect thereof, there is provided a radio transmitter capable of calculating an ideal value by adding an error component at a reference time to a theoretical value, and for comparing the ideal value with the error component in order to generate a reference level. Thereby, the present invention has the effect that it is possible to preciously suppress the spread of the band of the power spectrum without adjusting the reference power value after manufacturing.

According to another aspect of the present invention, there is provided a radio transmitter capable of controlling a gain of a first amplifier means based on the error component detected by a detection means. Thereby, the present invention has the effect that it is possible to preciously suppress the spread of the band of the power spectrum without adjusting the reference power value after manufacturing.

According to another aspect of the present invention, there is provided a radio transmitter incorporating a calculation means for calculating a theoretical value showing a burst waveform by using a window function. Thereby, the present invention has the effect that it is possible to easily get the theoretical value showing the burst waveform.

According to another aspect of the present invention, there is provided a radio transmitter incorporating a calculation means for calculating an envelope curve value based on the base-band signal, for calculating an error component by comparing the envelope curve value at the reference time with the specified power value, and for calculating the theoretical value by adding the error component to the envelope curve value per time. Thereby, the present invention has the effect that it is not necessary to calculate the theoretical value by using the window function and it is possible to apply the present invention to the compensation of the distortion in a transmitter chain in a device corresponding to a system based on the linear modulation method.

According to another aspect of the present invention, there is provided a radio transmitter incorporating a detection means and a generation means, the detection means comprises a first subtracter for outputting an error component by subtracting a power level from a theoretical value, and the generation means comprises a second subtracter for subtracting the error component outputted from the first subtracter to the ideal value obtained by an arithmetic means and for outputting a reference level. Thereby, the present invention has the effect that it is not necessary to store the error component and the reference level in a memory table and it is thereby possible to reduce the size of the memory.

According to another aspect of the present invention, there is provided a radio transmitter incorporating an arithmetic means comprising an adder for adding an error component at a reference time to a theoretical value and for outputting an ideal value. Thereby, the present invention has the effect that it is not necessary to store the theoretical value in the memory table and it is thereby possible to further reduce the size of the memory.

According to another aspect of the present invention, there is provided a radio transmitter incorporating an arithmetic means comprising a sample hold circuit for storing an error component at a reference time and for outputting the error component to the adder when receiving a timing signal. Thereby, the present invention has the effect that it is possible to reduce the amount of an arithmetic operation performed by software as small as possible because hardware can perform arithmetic operations for all of the values other than the theoretical value.

According to another aspect of the present invention, there is provided a radio transmission method in which an error component is detected by comparing a power level with a theoretical value, and an ideal value is calculated by adding the error component at a reference time to the theoretical value, and the ideal value is compared with the error component in order to generate a reference level. Thereby, the present invention has the effect that it is possible to preciously suppress the spread of the band of the power spectrum without adjusting the reference power value after manufacturing.

According to another aspect of the present invention, there is provided a radio transmission method in which an error component is detected by comparing a power level with a theoretical value, and a gain of a first amplifier means is controlled based on the detected error component. Thereby, the present invention has the effect that it is possible to accurately suppress the spread of the band of the power spectrum without adjusting the reference power value after manufacturing.

According to another aspect of the present invention, there is provided a radio transmission method in which a theoretical value showing a burst function is calculated by using a window function. Thereby, the present invention has the effect that it is possible to easily obtain the theoretical value showing the burst waveform.

According to another aspect of the present invention, there is provided a radio transmission method in which an envelope curve value is calculated based on a base-band signal, an error component is calculated by comparing the envelope curve value at a reference time with a specified power value, and the theoretical value is then calculated by adding the error component to the envelope curve value per time. Thereby, the present invention has the effect that it is not necessary to calculate the theoretical value by using the window function and it is possible to apply the present invention to the compensation of the distortion in the transmitter chain in the device corresponding to the system based on the linear modulation method.

BRIEF DESCRIPTION OF DRAWINGS

FIG. 5 is a diagram showing a band limitation of a transmission waveform.

FIG. 8 is a diagram showing data stored in a memory table.

FIG. 10 is a diagram showing data stored in a memory table.

BEST MODE FOR CARRYING OUT THE INVENTION

The best mode for carrying out the invention will now be described in detail with reference to the accompanying drawings.

FIRST EMBODIMENT

Figure 1:
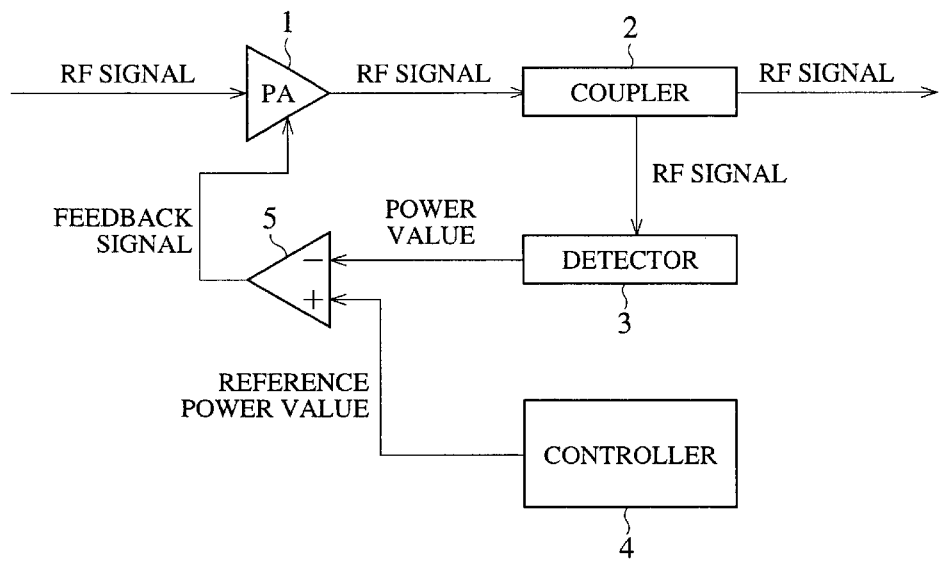
FIG. 1 is a diagram showing a configuration of a conventional radio transmitter.
Figure 6:
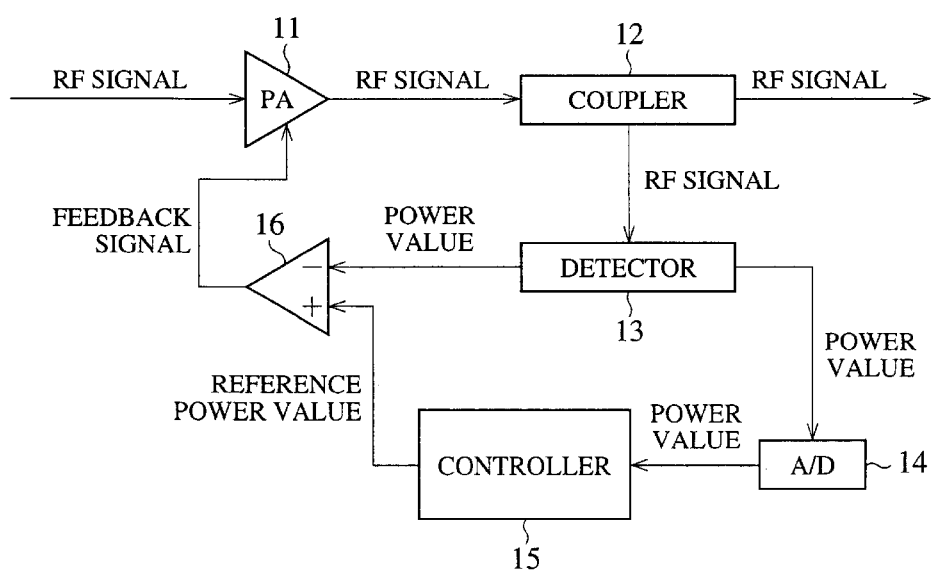
FIG. 6 is a diagram showing a configuration of a radio transmitter according to the first embodiment of the present invention.
Figure 2:
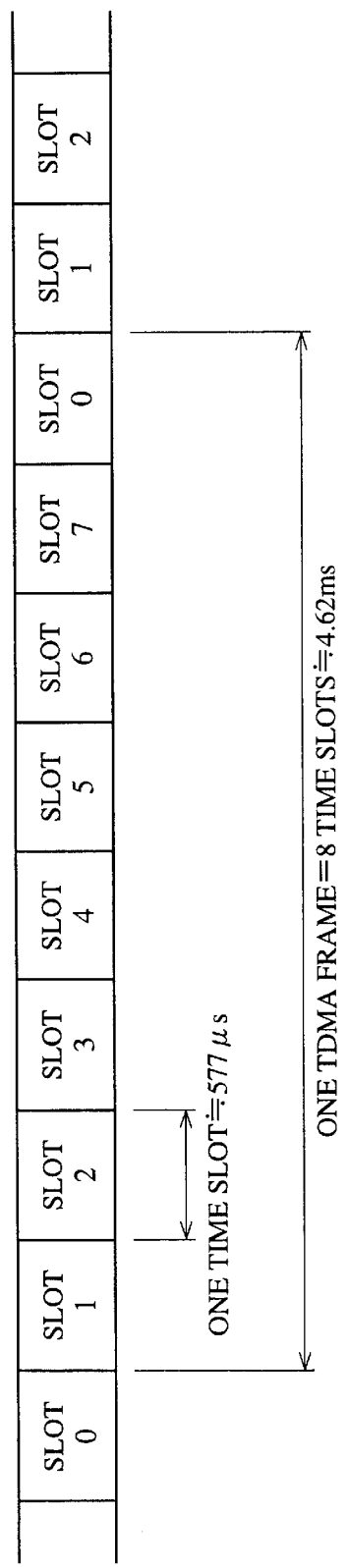
FIG. 2 is a diagram showing a frame configuration showing a TDMA frame.
Figure 3:
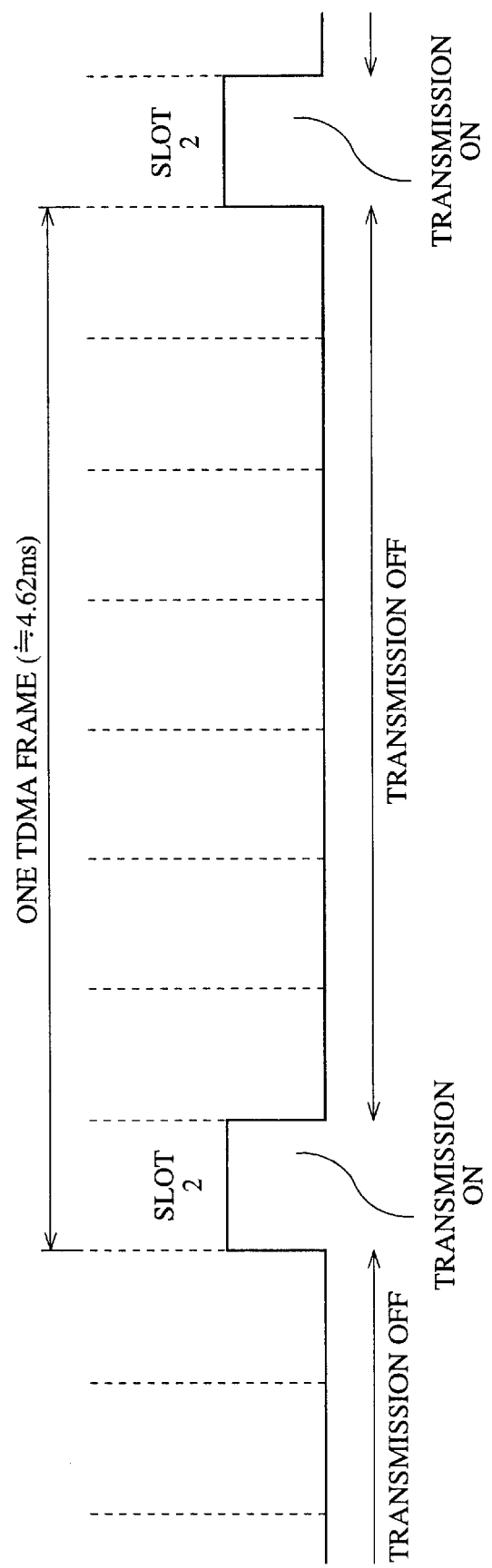
FIG. 3 is a diagram showing an operational state of the conventional radio transmitter.
Figure 4:
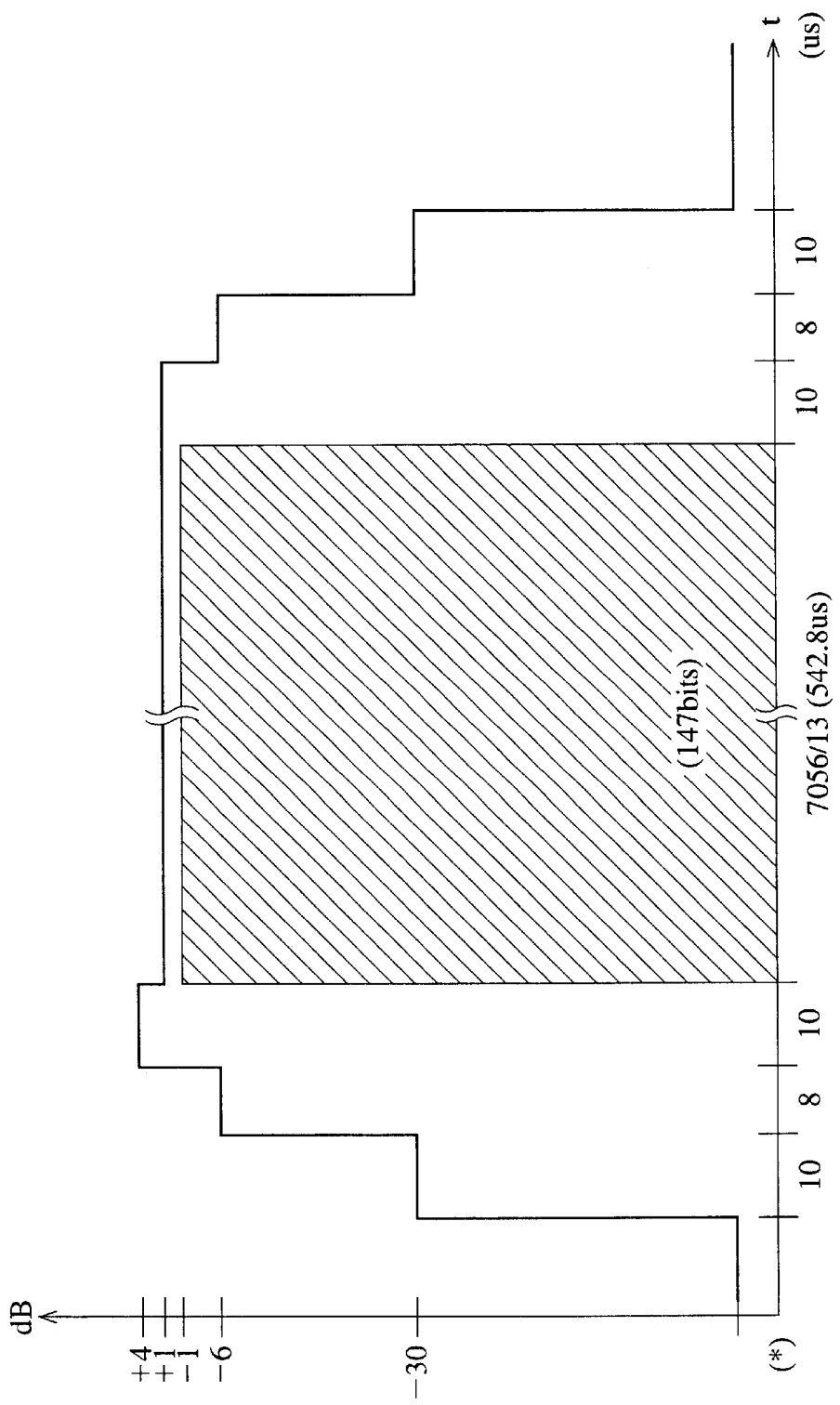
FIG. 4 is a diagram showing a transmission time mask that is specified in a standard.

FIG. 6 is a diagram showing a configuration of the radio transmitter according to the first embodiment of the present invention. In FIG. 6, the reference number 11 designates a power amplifier (amplifier means) for amplifying a RF signal that has been modulated based on GMSK modulation method, and 12 denotes a coupler (detection means) for outputting most of the power of the RF signal that has been amplified by the power amplifier 11 to a transmission antenna (not shown) and for outputting the remaining part of the power of the RF signal to a detector 13. The detector 13 detects the power value (power level) of the RF signal when the coupler 12 outputs this RF signal. The reference number 14 indicates an analogue to digital (A/D) converter (detection means) for performing the analogue to digital conversion for the power value. The reference number 15 designates a controller (detection means, arithmetic means, generation means). The controller 15 has the calculation function to calculate the theoretical value by using a window function and the like, the detection function to detect an error component by comparing the power value outputted from the A/D converter 14 with the theoretical value, the arithmetic function to perform an arithmetic operation for an ideal value by adding the error component at the reference time to the theoretical value, and the generation function to generate a reference power value (reference level). The controller 15 comprises a CPU, a DSP, a power source circuit, an audio circuit, a digital to analogue converter, and other components. The reference number 16 designates a differential amplifier (control means) for comparing the power value detected by the detector 13 with the reference power value generated by the controller 15 in order to generate a feedback signal to control the gain of the power amplifier 11.

Figure 7:
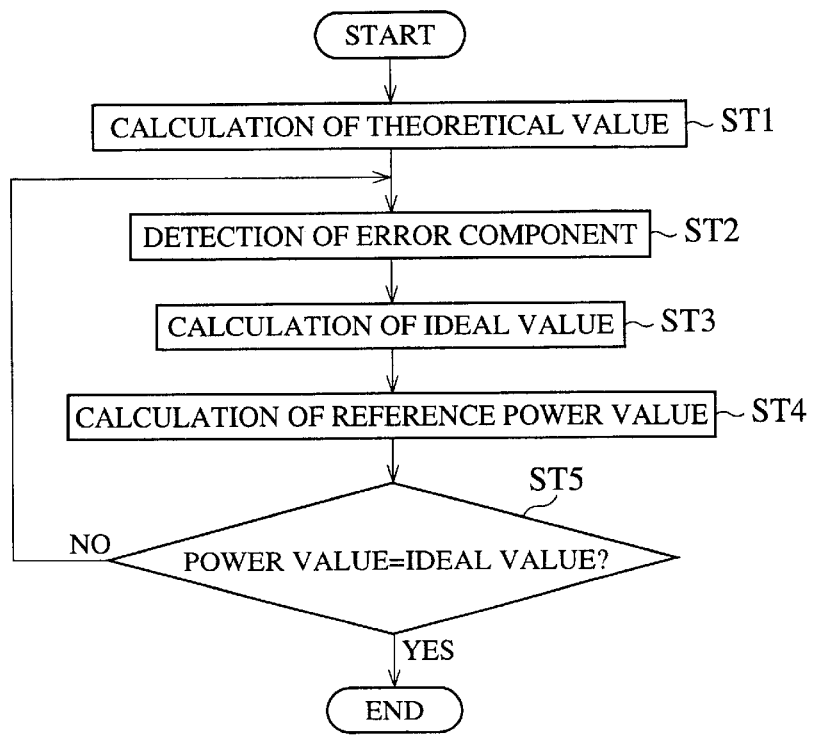
FIG. 7 is a flow chart showing a radio transmission method according to the first embodiment of the present invention.

FIG. 7 is a flow chart showing the radio transmission method according to the first embodiment of the present invention.

Next, a description will be given of the operation.

First, when the power amplifier 11 amplifies the RF signal, the coupler 12 separate a slight part of the power of the RF signal and then outputs the separated part of the power of the RF signal to the detector 13. When receiving the separated part of the power of the RF signal, the detector 13 detects the power value of this RF signal from the coupler 12. Then, the A/D converter 14 performs the A/D conversion for the power value as the detection result by the detector 13 and then outputs the power value in digital form.

When receiving the power value of the RF signal supplied from the A/D converter 14, the controller 15 performs the compensation process to compensate the shape of the rising edge and the falling edge of the power value of the RF signal into an optimum shape based on the received power value. The compensation process by the controller 15 is executed only for the time interval determining each of the rising edge and the falling edge of the RF signal as a transmission wave, not executed for the time interval determining the power value of the RF signal.

Hereinafter, the processing procedure of the controller 15 will be explained in detail.

First, the power value of the RF signal is determined based on the feedback signal supplied to the power amplifier 11. This feedback signal is determined based on the reference power value that has been also described in the explanation for the conventional example.

The controller 15 calculates a theoretical value showing an ideal burst waveform by using a Hamming window or a Hanning window, for example, in order to determine a final reference power value (Step ST1).

After calculating the theoretical value, the controller 15 compares the power value in digital form obtained by the A/D converter 14 with the theoretical value in order to detect an error component (Step ST2).

Because the ideal detection result (the ideal value) of the power value means that the shape of each of the rising edge and the falling edge of the RF signal is equal to the theoretical value that has been calculated previously (that is to say, having a same error component), the ideal value is obtained by adding the error component at the reference time to the theoretical value (Step ST3).

After calculating the theoretical value, the controller 15 compares the error component with the theoretical value in order to calculate a reference power value at each time (Step ST4). Thereby, the power value detected by the detector 13 becomes equal to the ideal value calculated by the controller 15. If this power value is not equal to this ideal value and the difference between both values is not neglected, the preceding steps ST2 to ST4 may be repeated.

Hereinafter, the operation of the controller 15 will be described in more detail with reference to FIG. 8.

The operation only for the rising edge will be explained so that it can be understood easily.

FIG. 8 shows the rising edge by using fifteen stages 1 to 15 (bit 1 to bit 15). The number of the stages can be determined according to a design concept based on a processing function of software, a performance of each of the D/A converter, A/D converter 14, other components, and a cost. In addition, there is no problem or it is acceptable that the D/A converter is separated in location from the controller 15 like the A/D converter 14, or the controller 15 incorporates the A/D converter 14.

In the first embodiment, the theoretical value "a" at "bit 1", (Field or Coordinate (C, 6) in the table shown in FIG. 8) indicates a same value in a time interval to determine the power value of the RF signal, in general, that is determined based on the adjustment to the transmission power of the radio transmitter. When this theoretical value "a" is determined, the ideal value at an optional point can be calculated by using the theoretical values "b" to "o" (Coordinates (C,7) to (C,20)) (Step ST1).

For example, we will consider "bit 8" as an optional point. When the power value as the detection result at the "bit 8" is "hh" (Coordinate (D, 13)), the error component can be detected as "hh−h=h'") (Coordinate (E, 13) (Step ST2).

Based on the reference "aa−a=a'" as the error component of the "bit 1", the ideal value of the "bit 8" can be calculated as "h+a'" (Coordinate (F, 13)) (Step ST3).

By using the same manner, other points can be calculated by adding the value "a'" to each of the theoretical values "a" to "o" based on the error component "a'" of the "bit 1"

As is evident from the previous explanation, the reference power value "(h+a')−h'" can be calculated by subtracting the error component "h'" from the ideal value "h+a'" (Step ST4).

The data in the table shown in FIG. 8 are stored in the memory table in the controller 15. However, it is not always necessary to store all of the data. When a memory size of the memory table is small, the values as the reference "bit 1" (Coordinate (*, 6)) and the theoretical values (Coordinate (C, *) ) can be stored in the memory table. In this case, other data can be calculated based on the stored data described above.

Similarly, the same processing described above can be applied to the processing for the falling edge of the RF signal.

In addition, it is also possible to use the data obtained by the processing for the rising edge as the data for the falling edge in a line symmetry because the shapes of the rising edge and the falling edge are perfectly equal to each other in right and left symmetry.

As can be understood described above, according to the first embodiment, the ideal value is calculated by adding the error component at the reference time to the theoretical value, and the ideal value is compared with the error component in order to generate the reference power value. Thereby, even if the shape of the reference power value on the time axis before compensation is not equal to the shape of the RF signal on the time axis, it is possible to obtain the effect to suppress the spread of the power spectrum preciously without adjusting the reference power value after manufacturing.

Furthermore, even if the characteristics of the power amplifier 11 and the coupler 12 forming the radio transmitter have variations, it is possible to suppress a distortion generated in the shape of each of the rising edge and the falling edge.

SECOND EMBODIMENT

Figure 9:
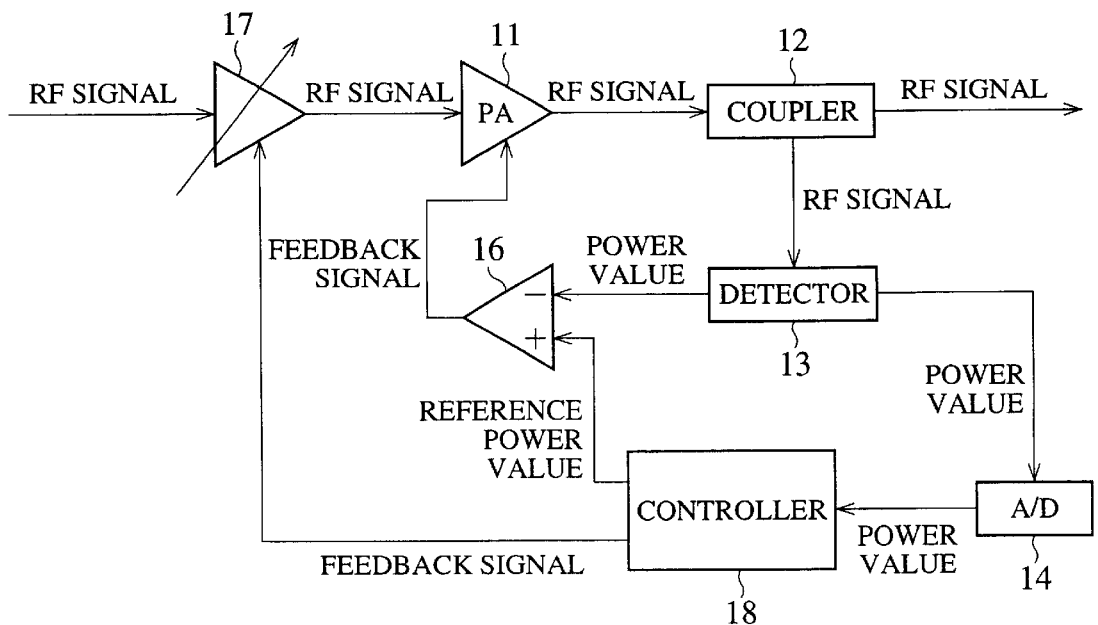
FIG. 9 is a diagram showing a configuration of a radio transmitter according to the second embodiment of the present invention.

FIG. 9 is a diagram showing a configuration of the radio transmitter according to the second embodiment of the present invention. In FIG. 9, the same reference numbers and the same reference characters in FIG. 6 indicate the same components or the same parts, and the explanation for them is therefore omitted here.

The reference number 17 designates a variable gain amplifier for amplifying the RF signal that has been modulated based on GMSK modulation method, and for outputting the RF signal to the power amplifier (a second amplifier means) 11. The reference number 18 denotes a controller (a detection means, a first control means). The controller 18 has a detection function for detecting an error component by comparing a power value outputted from the A/D converter 14 with a theoretical value, an output function for outputting a reference power value that is previously set to a differential amplifier (a second control means) 16, an arithmetic function for calculating an ideal value by adding the error component to the theoretical value, and an output function for outputting the ideal value as a feedback signal to the variable gain amplifier 17.

Next, a description will be given of the operation.

Although the gain of the power amplifier 1 is controlled in order to compensate the shape of the RF signal in the first embodiment, it is possible to compensate the shape of the RF signal by controlling the gain of the variable gain amplifier 17.

That is to say, the feedback signal to be supplied to the power amplifier 11 is determined based on a difference between the reference power value that has been set in advance (for example, the reference power value by which the shape of the RF signal is changed to a shape of a square wave) and the power value, like the conventional example.

On the other hand, the controller 18 calculates the feedback signal to be supplied to the variable gain amplifier 17 as follows.

The controller 18 compares the power value outputted from the A/D converter 14 with the theoretical value in order to detect an error component, adds the error component to the theoretical value in order to calculate an ideal value. This ideal value becomes the feedback signal.

For example, the ideal value in "bit 8" becomes "h+h'" in this second embodiment. This ideal value "h+h'" is set to the field of Coordinate (F, 13) in the memory table shown in FIG. 8 instead of the value "h+a'" in the first embodiment. Because it is thereby possible to change the shape of the RF signal to the shape shown in FIG. 5(c) (The variable gain amplifier 17 changes the shape of each of the rising edge and the falling edge of the RF signal to a curve shape.), the spread of the power spectrum can be suppressed preciously, like the first embodiment.

In addition, because it is not necessary for the controller 18 to execute the arithmetic operation for the reference voltage value, there is the effect that the configuration of the radio transmitter simplifies the arithmetic operation.

THIRD EMBODIMENT

In the first and second embodiments described above, the theoretical value showing a burst waveform is calculated by using the theory of the window function. However, it is possible to calculate an envelope curve value based on a base-band signal, to calculate an error component by comparing the envelope curve value at a reference time with a specified power value, and then to calculate the theoretical value by adding the error component to the envelope curve value at each time.

In general, the envelope curve can be obtained by calculating the square root of $(I^2+Q^2)$, where I and Q are I signal and Q signal of the base-band signal to be modulated. For example, when a constant envelope curve modulation method such as GMSK modulation is used, the envelope curve of the interval of data becomes a constant. On the other hand, in the burst transmission, both I and Q signals of the base-band signal are not outputted during the time interval of the transmission OFF state and these both I and Q signals are outputted during the time interval of the transmission ON state. In this case, the power spectrum has no spread of the band thereof unless the modulator has no distortion when a band limitation processing is performed for the rising edge and the falling edge. The ideal value is calculated by using the above $[\sqrt{(I^2+Q^2)}]$ about the rising edge and the falling edge of the I and Q signals in the base-band signal, that is to say, by using amplitude information.

For easier understanding of the operation, like the first embodiment, the operation only for the rising edge will be described in the third embodiment as follows. In addition, the part of the rising edge will be represented by using fifteenth stages (bit 1 to bit 15) in the third embodiment.

In FIG. 10, a value "a" (indicated by Coordinate (C, 6)) as the specified power determined value of "bit 1" is the values in the time interval to be used for determining the power value of the RF signal.

On the other hand, BB information indicated by Coordinate (D, *) shown in FIG. 10 are the amplitude information $[\sqrt{(I^2+Q^2)}]$ that have been obtained based on I signal and Q signal in the base-band signal to be modulated.

By the way, "bb1" (Coordinate (D, 6)) as BB information of "bit 1" is not always equal to the specified power determined value "a". Accordingly, the error component (Coordinate (E, 6)) in the BB information as reference is calculated as "a−bb1=bbe". The specified power determined value "a" is obtained by adding this calculated value to the BB information of "bit 1".

For easier understanding of the operation, like the first embodiment described above, we will consider a "bit 8", as an optional position, for example.

The BB information of "bit 8" is "bb8" (Coordinate (D, 13). The level conversion of the value "bb8" is performed by using the above value "bbe" that has an adequate correlation of the specified power determined value "a". The value "bb8+bbe=bb8'" (Coordinate (F, 13)) is obtained as BB information after this level conversion.

When the detection result of "bit 8" is "hh" (Coordinate (G, 13), the BB information after the level conversion and the error component as the difference of the power value can be calculated as "hh−bb8'=h'" (Coordinate (H, 13)).

On the other hand, based on the value "aa−bb1'=a'" that is the error component of "bit 1", the ideal value of "bit 8" can be calculated as the value "bb8'+a'" (Coordinate (I, 13)).

In the same manner of the case described above, based on the error component "a" of "bit 1", the shape of the ideal value for each of other points is different from the BB information after the level conversion by the absolute "a'".

Next, the reference power value "(bb8'+a')−h')" (Coordinate (J, 13) may be calculated by subtracting the error component "h'" from the ideal value "bb8'+a'".

As can be understood described above, according to the third embodiment, the envelope curve value is calculated based on the base-band signal, the error component is then calculated by comparing the envelope curve value at the reference time with the specified power value, and the ideal value is calculated by adding the error component to the envelope curve value at each time. It is not necessary to calculate the theoretical value by suing any window function. Thereby, there is the effect that he third embodiment can be applied to the compensation for a distortion in a transmission system based on a linear modulation method such as π/4 shift QPSK modulation, for example.

FOURTH EMBODIMENT

Figure 11:
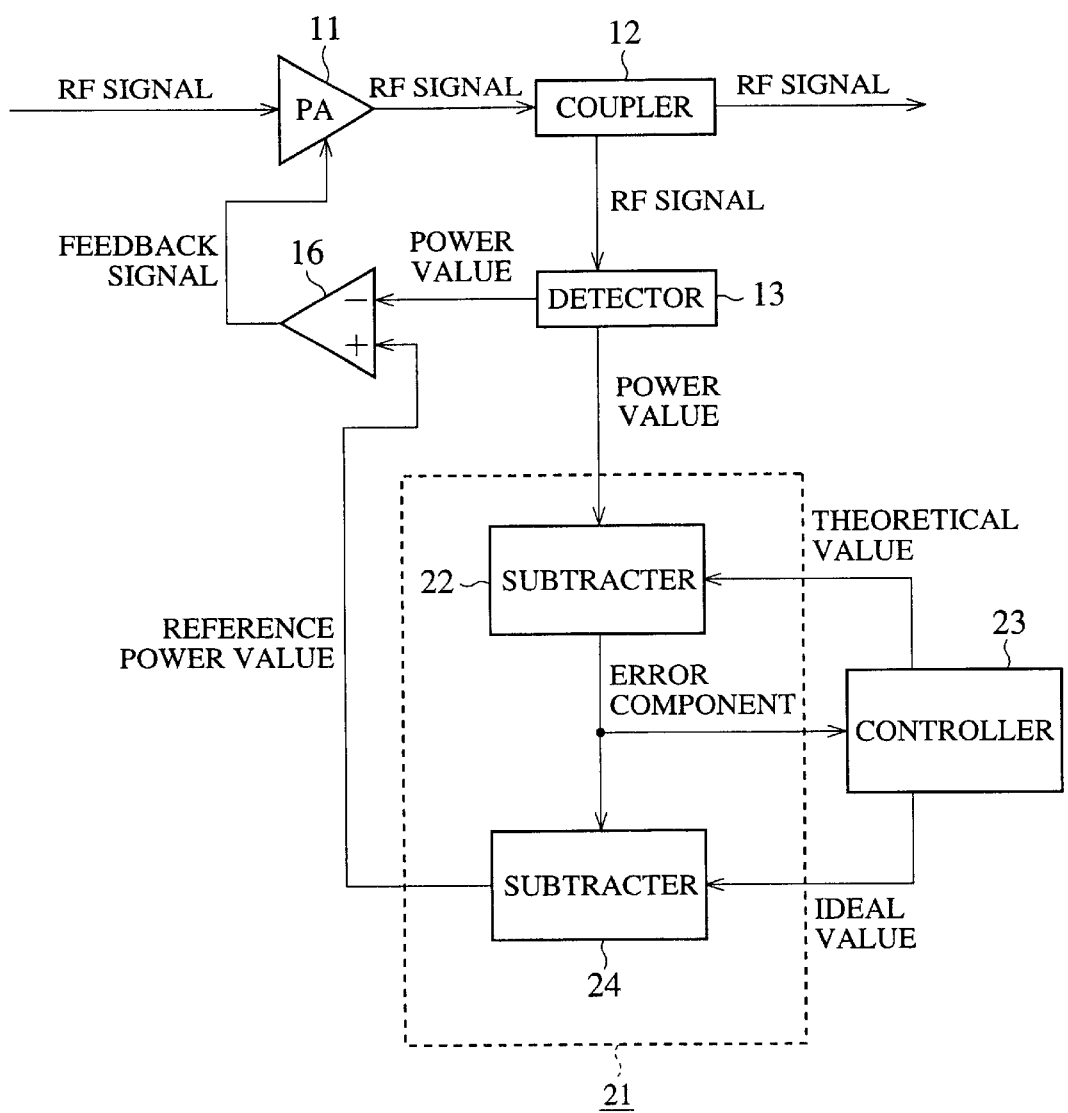
FIG. 11 is a diagram showing a configuration of a radio transmitter according to the fourth embodiment of the present invention.

FIG. 11 is a diagram showing a configuration of the radio transmitter according to the fourth embodiment of the present invention. In FIG. 11, the same reference numbers and the same reference characters in FIG. 6 indicate the same components or the same parts, and the explanation for them is therefore omitted here. The reference number 21 designates a waveform compensation circuit for calculating a reference power value based on a power value detected by the detector 13, and the reference number 22 denotes a subtracter for subtracting the power value from the theoretical value outputted from the controller 23, and for outputting an error component. The controller 23 calculates the theoretical value by using a window function and the like and for calculating an ideal value by adding the error component at a reference time to the theoretical value. The reference number 24 indicates a subtracter for subtracting the error component outputted from the subtracter 22 from the ideal value calculated by the controller 23 and for outputting the reference power value.

Next, a description will be given of the operation.

The first embodiment described above shows the case in which the error component and the reference power value and other values are calculated by software. However, it is possible to calculate those values by hardware. That is to say, when the controller 23 calculates the theoretical value based on the window function, the subtracter 22 subtracts the power value from the theoretical value (this theoretical value is an analogue signal that has been converted by the D/A converter incorporated in the controller 23) in order to obtain an error component, and then outputs this error component.

On the other hand, when the subtracter 22 outputs the error components, the controller 23 calculates the ideal value by adding the error component (this error component is a digital signal that has been converted by the A/D converter) to the theoretical value.

The subtracter 24 calculate the reference power value by subtracting the error component outputted from the subtracter 22 from the ideal value (this ideal value is an analogue signal that has been converted by the D/A converter in the controller 23) calculated by the controller 23, and then outputs the reference power value.

As can be understood described above, according to the fourth embodiment, the detection means comprises the subtracter 22 for outputting the error component that is calculated by subtracting the power value from the theoretical value. The generation means comprises the subtracter 24 that outputs the reference level that is calculated by subtracting the error component outputted from the subtracter 22 from the ideal value calculated by the controller 23. Thereby, it is not necessary to store the error component and the reference power value to the memory table and the memory size can be decreased. In addition, because the subtracters 22 and 24 output the error component and the reference power value, there is the effect that the controller 23 can simplify the arithmetic operation.

FIFTH EMBODIMENT

Figure 12:
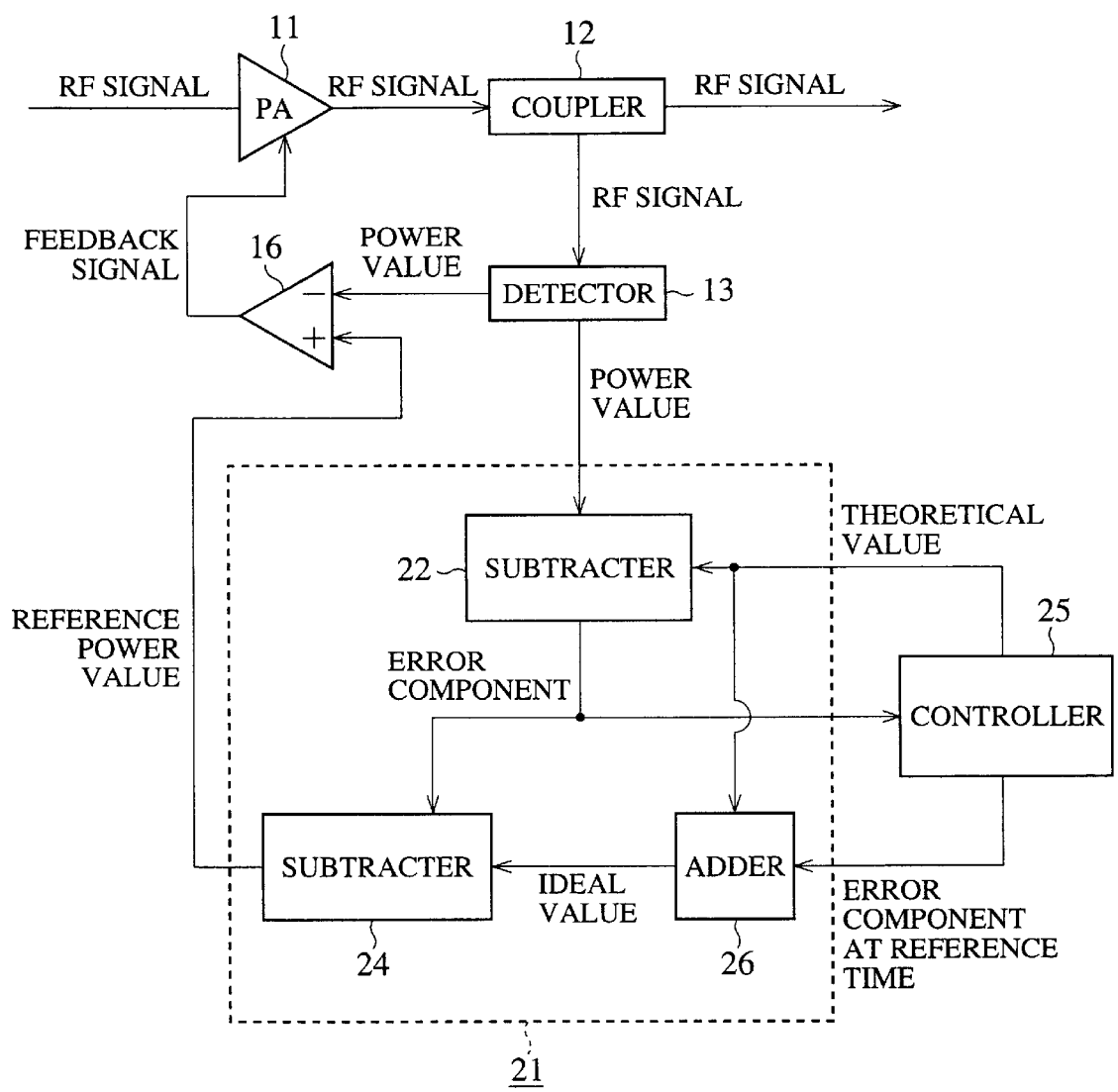
FIG. 12 is a diagram showing a configuration of a radio transmitter according to the fifth embodiment of the present invention.

FIG. 12 is a diagram showing a configuration of the radio transmitter according to the fifth embodiment of the present invention. In FIG. 12, the same reference numbers and the same reference characters in FIG. 11 indicate the same components or the same parts, and the explanation for them is therefore omitted here. The reference number 25 designates a controller for calculating a theoretical value by using a window function and for outputting an error component at a reference time. The reference number 26 denotes an adder for adding the error component at the reference time to the theoretical value and for outputting the ideal value.

Next, a description will be given of the operation.

The fourth embodiment described above shows the case in which the controller 23 calculates the theoretical value by using software. However, it is possible to calculate the ideal value by hardware. That is to say, when the controller 25 outputs the theoretical value and the error component of "bit 1", the adder 26 adds the error component of "bit 1" to the theoretical value in order to calculate an ideal value and outputs the ideal value.

As can be understood described above, according to the fifth embodiment, the arithmetic means comprises the adder for outputting the ideal value by adding the error component at the reference time to the theoretical value. It is thereby possible to further reduce the memory size because it is not necessary to store the ideal value to the memory table. In addition, the controller 25 can simplify the arithmetic operation because the adder 26 can output the ideal value.

SIXTH EMBODIMENT

Figure 13:
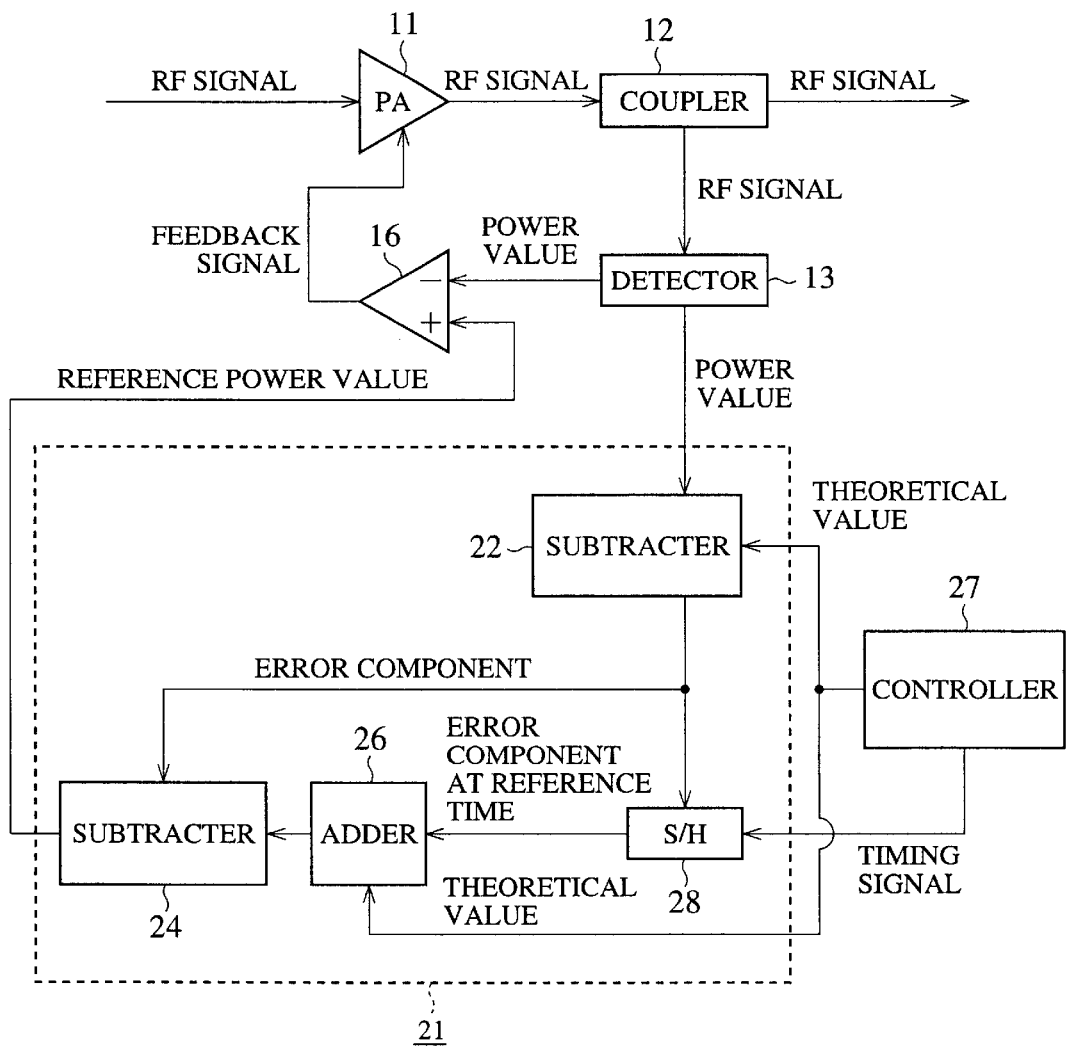
FIG. 13 is a diagram showing a configuration of a radio transmitter according to the sixth embodiment of the present invention.

FIG. 13 is a diagram showing a configuration of the radio transmitter according to the sixth embodiment of the present invention. In FIG. 13, the same reference numbers and the same reference characters in FIG. 12 indicate the same components or the same parts, and the explanation for them is therefore omitted here. The reference number 27 designates a controller for calculating a theoretical value by using a window function and for outputting a timing signal. The reference number 28 denotes a sample and hold circuit for storing an error component at a reference time when receiving the timing signal from the controller 27.

Next, a description will be given of the operation.

The fifth embodiment described above shows the case in which the controller 25 outputs the error component at the reference time. However, it is possible for the sample and hold circuit 28 to output the error component at the reference time.

That is to say, when the controller 27 outputs the timing signal in the timing in which the detector 13 outputs the power value of "bit 1", the sample and hold circuit 28 stores the error component of "bit 1" outputted from the subtracter 22 and then outputs this error component of "bit 1" to the adder 26 continuously.

As can be understood described above, according to the sixth embodiment, the arithmetic means comprises the sample and hold circuit 28 for storing the error component at the reference time when receiving the timing signal, and for outputting the error component to the adder 26. It is thereby possible to calculate the values other than the theoretical value by hardware, and the amount of the operation to be performed by software can be reduced as small as possible.

For example, when an external device calculates the theoretical value and the controller 27 comprises the memory table only for storing this theoretical value, there is the effect that it is possible to eliminate the execution for all of the arithmetic operations from the controller 27.

INDUSTRIAL APPLICABILITY

As described, the radio transmitter and the radio transmission method according to the present invention can be applied to mobile communication devices such as cellular telephones that require compensation operation for the spread of a band of a power spectrum when the transmission waveform is transmitted in burst transmission.

I claim:
1. A radio transmitter comprising:
   amplifier means for amplifying a modulated signal;
   detection means for detecting a power level of said modulated signal amplified by said amplifier means, and for detecting an error component by comparing said power level with a theoretical value;
   arithmetic means for calculating an ideal value by adding an error component in said error component detected by said detection means to said theoretical value;
   generation means for generating a reference level by comparing said ideal value calculated by said arithmetic means with said error component detected by said detection means; and
   control means for controlling a gain of said amplifier means based on a difference between said power level detected by said detection means and said reference level generated by said generation means.
2. A radio transmitter comprising:
   first amplifier means for amplifying a modulated signal;
   second amplifier means for amplifying said modulated signal that has been amplified by said first amplifier means;
   detection means for detecting a power level of said modulated signal amplified by said second amplifier means, and for detecting an error component by comparing said power level with a theoretical value;
   first control means for controlling a gain of said first amplifier means based on said error component detected by said detection means; and
   second control means for controlling a gain of said second amplifier means based on a difference between said power level detected by said detection means and a reference level.
3. A radio transmitter according to claim 1, further comprises calculation means for calculating said theoretical value that indicates a burst waveform by using a window function.
4. A radio transmitter according to claim 2, further comprises calculation means for calculating said theoretical value that indicates a burst waveform by using a window function.
5. A radio transmitter according to claim 1, further comprises calculation means for calculating an envelope curve value based on a base-band signal, for calculating an error component by comparing said envelope curve value at a reference time with a specified power value, and for calculating an ideal value by adding said error component to said envelope curve value at each time.

6. A radio transmitter according to claim 2, further comprises calculation means for calculating an envelope curve value based on a base-band signal, for calculating an error component by comparing said envelope curve value at a reference time with a specified power value, and for calculating an ideal value by adding said error component to said envelope curve value at each time.

7. A radio transmitter according to claim 1, wherein said detection means comprises a first subtracter for subtracting said power level from said theoretical value and for outputting said error component, and said generation means comprises a second subtracter for subtracting said error component outputted by said first subtracter from said ideal value obtained by said arithmetic means and for outputting said reference level.

8. A radio transmitter according to claim 7, wherein said arithmetic means comprises an adder for adding said error component at said reference time to said theoretical value and for outputting said ideal value.

9. A radio transmitter according to claim 8, wherein said arithmetic means further comprises a sample and hold circuit for storing said error component at said reference time when receiving a timing signal, and for outputting said error component to said adder.

10. A radio transmission method comprising the steps of:

detecting a power level of a modulated signal when an amplifier amplifies said modulated signal, and detecting an error component by comparing said power level with a theoretical value;

calculating an ideal value by an arithmetic operation in which an error component in said error component and said theoretical value are added;

generating a reference level by comparing said ideal value with said error component; and controlling a gain of said amplifier means based on a difference between said power level and said reference level.

11. A radio transmission method, comprising the steps of:

detecting a power level of a modulated signal and then detecting an error component by comparing said power level with a theoretical value when a first amplifier amplifies said modulated signal and a second amplifier then amplifies said modulated signal;

controlling a gain of said first amplifier based on said error component; and controlling a gain of said second amplifier based on a difference between said power level and a reference level.

12. A radio transmission method according to claim 10, wherein an ideal value indicating a burst waveform is calculated based on a window function.

13. A radio transmission method according to claim 11, wherein an ideal value indicating a burst waveform is calculated based on a window function.

14. A radio transmission method according to claim 10, wherein an envelope curve value is calculated based on a base-band signal, an error component is calculated by comparing said envelope curve value at a reference time with a specified power value, and an ideal value is calculated by adding said error component to said envelope curve value at each time.

15. A radio transmission method according to claim 11, wherein an envelope curve value is calculated based on a base-band signal, an error component is calculated by comparing said envelope curve value at a reference time with a specified power value, and an ideal value is calculated by adding said error component to said envelope curve value at each time.

* * * * *

UNITED STATES PATENT AND TRADEMARK OFFICE
CERTIFICATE OF CORRECTION

PATENT NO. : 6,519,293 B1
DATED : February 11, 2003
INVENTOR(S) : Atsushi Miyake It is certified that error appears in the above-identified patent and that said Letters Patent is hereby corrected as shown below:

Title page,
Item [22], "PCT Filed: Mar. 3, 1998" should be -- [22] PCT Filed: Jun. 3, 1998 --.
Item [86], "§371(c)(1),(2),(4) Date: Dec. 10, 1999" should be -- §371(c)(1),(2),(4) Date: Dec. 9, 1999 --.

Signed and Sealed this

Twenty-second Day of July, 2003

JAMES E. ROGAN
*Director of the United States Patent and Trademark Office*